US008769380B1

(12) United States Patent
Burd et al.

(10) Patent No.: US 8,769,380 B1
(45) Date of Patent: Jul. 1, 2014

(54) METHODS AND APPARATUS FOR ERROR RECOVERY IN MEMORY SYSTEMS EMPLOYING ITERATIVE CODES

(75) Inventors: Gregory Burd, San Jose, CA (US); Nedeljko Varnica, San Jose, CA (US); Yifei Zhang, Milpitas, CA (US); Nitin Nangare, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 142 days.

(21) Appl. No.: 13/285,723

(22) Filed: Oct. 31, 2011

Related U.S. Application Data

(60) Provisional application No. 61/409,182, filed on Nov. 2, 2010, provisional application No. 61/415,774, filed on Nov. 19, 2010.

(51) Int. Cl.
 *H03M 13/00* (2006.01)
 *H03M 13/11* (2006.01)
 *H03M 13/45* (2006.01)
 *H04L 1/00* (2006.01)

(52) U.S. Cl.
 CPC ......... *H03M 13/1128* (2013.01); *H04L 1/0051* (2013.01); *H03M 13/458* (2013.01)
 USPC .......................................... 714/774; 714/781

(58) Field of Classification Search
 CPC .................... H03M 13/1128; H03M 13/2948; H03M 13/2957; H03M 13/2975; H03M 13/458; H04L 1/005; H04L 1/0051
 USPC .......... 714/780, 773, 774, 764, 781, 786, 799
 See application file for complete search history.

(56) References Cited

U.S. PATENT DOCUMENTS

| 7,237,181 | B2 * | 6/2007 | Richardson ................... 714/780 |
| 7,650,561 | B1 * | 1/2010 | Ulriksson et al. ............. 714/795 |
| 8,127,209 | B1 * | 2/2012 | Zhang et al. .................. 714/780 |
| 8,219,878 | B1 * | 7/2012 | Varnica et al. ................ 714/758 |
| 2005/0172199 | A1 * | 8/2005 | Miller et al. .................. 714/749 |
| 2009/0019335 | A1 * | 1/2009 | Boyer et al. .................. 714/755 |
| 2010/0088575 | A1 * | 4/2010 | Sharon et al. ................. 714/763 |
| 2011/0219282 | A1 * | 9/2011 | Lee ............................... 714/755 |
| 2011/0219284 | A1 * | 9/2011 | Uchikawa et al. ............ 714/763 |
| 2012/0030539 | A1 * | 2/2012 | Graef et al. ................... 714/758 |
| 2013/0073922 | A1 * | 3/2013 | Varnica et al. ................ 714/758 |

OTHER PUBLICATIONS

Lin Liu; Sanyuan Zhang; Xiuzi Ye; Yin Zhang, "Error resilience schemes of H.264/AVC for 3G conversational video services," Computer and Information Technology, 2005. CIT 2005. The Fifth International Conference on , vol., No., pp. 657, 661, Sep. 21-23, 2005.*

(Continued)

*Primary Examiner* — Cynthia Britt

(57) ABSTRACT

Systems and methods for error recovery are presented. Data is decoded with an iterative decoding scheme having a first set of parameters. In response to a determination that the iterative decoding scheme has failed, the data is re-read. While the data is being re-read, the iterative decoding scheme is reconfigured with a second set of parameters, and the data is decoded with the reconfigured iterative decoding scheme. In response to determination that the reconfigured iterative decoding scheme has failed, an error type associated with the data is determined. An error recovery scheme is selected from a plurality of error recovery schemes for the data based on the determined error type.

20 Claims, 10 Drawing Sheets

(56) References Cited

OTHER PUBLICATIONS

Jue Wang; Liang Ji, "A region and data hiding based error concealment scheme for images," Consumer Electronics, IEEE Transactions on, vol. 47, No. 2, pp. 257, 262, May 2001.*

MacKay, D., et al., "Weaknesses of Margulis and Ramanujan-Margulis Low-Density Parity-Check Codes", Electronic Notes in Theoretical Computer Science 74 (2003), 8 pages.

Richardson, "Error Floors of LDPC Codes", in Proc. 41st Allerton Conf. Comm., Control, and Comput., Monticello, IL, 2003, 10 pages.

* cited by examiner

METHODS AND APPARATUS FOR ERROR RECOVERY IN MEMORY SYSTEMS EMPLOYING ITERATIVE CODES

CROSS-REFERENCE TO RELATED APPLICATIONS

This application claims the benefit under 35 U.S.C. §119 (e) of U.S. Provisional Application No. 61/409,182 filed Nov. 2, 2010 and U.S. Provisional Application No. 61/415,774, filed on Nov. 19, 2010, both of which are hereby incorporated by reference herein in their entireties.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly not impliedly admitted as prior art against the present disclosure.

The present disclosure relates generally to memory systems and methods, and in particular to systems and methods for error recovery in memory systems that use iterative codes.

In the last several years, the hard drive (HDD) industry has started transitioning from memory system architectures using Reed Solomon (RS) Error Correction Codes (ECC) to memory system architectures using iterative (ITR) codes. The first generation of iterative architectures featured a concatenation of inner iterative code with outer RS ECC. The second generation iterative architectures have completely removed the RS ECC. Such second generation architectures referred to as RS-less ECC architectures.

Iterative codes have a distinct advantage over RS codes with regard to error correction of random-noise type of errors. For example, since most errors that are due to random noise have low reliability, the usage of soft decisions by an RS-less decoder can result in significant storage capacity gains (or, equivalently, in lower signal-to-noise ratio (SNR) operating points) when compared RS ECC decoders, which operate using hard decisions.

However, iterative codes are particularly vulnerable against certain types of "exception errors". A large number of consecutive errors within received data (due to, e.g., media defects or thermal asperities) may be easier to correct via an RS code then via an iterative code. This is especially the case when the soft information provided to the iterative decoder is in error and strongly points in the wrong direction.

Since a significant portion of hard failures in HDD memory systems are driven by exceptions, systems and methods are needed that can sustain stringent data reliability standards while allowing HDD industry to reach new capacity milestones.

SUMMARY OF THE DISCLOSURE

In one embodiment of the present disclosure, a method for correcting errors is disclosed. The method includes decoding data with an iterative decoding scheme having a first set of parameters. The method further includes rereading the data in response to determining that the iterative decoding scheme has failed. The method further includes while the data is being re-read, reconfiguring the iterative decoding scheme with a second set of parameters and decoding the data with the reconfigured iterative decoding scheme. The method further includes in response to determining that the reconfigured iterative decoding scheme has failed, determining an error type associated with the data. The method further includes selecting one error recovery scheme of a plurality of error recovery schemes for the data based on the determined error type.

In some implementations, the method further includes determining a syndrome weight of a syndrome associated with the data. The error type associated for the data is determined based on comparing the syndrome weight with one or more thresholds.

In some implementations, the method further includes determining the error type associated with the data to be an error floor event if a syndrome weight of a syndrome associated the data is less than a threshold. The method further includes in response to determining the error type to be an error floor event, decoding the data using one or more of a near-codeword trapping scheme, a noise-biasing scheme, or a log-likelihood ratio biasing scheme.

In some implementations, the method further includes determining the error type associated with the data to be a synchronization error event if a syndrome weight of a syndrome associated with the data is greater than a threshold. The method further includes re-synchronizing the data using a re-synchronization scheme. The method further includes decoding the re-synchronized data with the iterative decoding scheme.

In some implementations, the method further includes in response to determining that the iterative decoding scheme has failed to correctly decode the re-synchronized data, adjusting synchronization parameters used to read data from a storage device. The method further includes re-reading the data from the storage device using the adjusted synchronization parameters.

In some implementations, the method further includes detecting a defect within the decoded data with a defect detection scheme, wherein the defect detection scheme is optimized for detecting defects having a first length. The method further includes reconfiguring the defect detection scheme to be optimized for detecting defects having a second length smaller than the first length. The method further includes performing error-and-erasure decoding on the data using the reconfigured defect detection scheme.

In some implementations, the method further includes in response to determining that the one error recovery scheme has failed, selecting another error recovery scheme for the data. The method further includes processing the data using the another error recovery scheme.

In some implementations, the re-reading of the data is stopped in response to determining that the reconfigured iterative decoding scheme has correctly decoded the data.

In some implementations, the data is read from a magnetic disk drive.

In another embodiment of the present disclosure, a system for correcting errors is disclosed. The system includes receiver circuitry configured to decode data with an iterative decoding scheme having a first set of parameters. The receiver circuitry is further configured to in response to determining that the iterative decoding scheme has failed, re-read the data. The receiver circuitry is further configured to, while the data is being re-read, reconfigure the iterative decoding scheme with a second set of parameters and decode the data with the reconfigured iterative decoding scheme. The receiver circuitry is further configured to, in response to determining that the reconfigured iterative decoding scheme has failed, determine an error type associated with the data. The receiver circuitry is further configured to select one error recovery scheme of a plurality of error recovery schemes for the data based on the determined error type.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the disclosure, certain illustrative embodiments will now be described. However, the systems and methods described herein may be adapted and modified as is appropriate for the application being addressed and that the systems and methods described herein may be employed in other suitable applications, and that such other additions and modifications will not depart from the scope hereof.

As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

The present disclosure describes several post-processing mechanisms for detecting and correcting defects in decoded data using iterative decoding. In embodiments described below, when initial decoding of data received from a channel fails to return a valid codeword, an error recovery mode is initiated which operates on blocks of the decoded data to detect and correct residual defects in the blocks. The post-processing mechanisms described herein rely on iterative decoding principles, and may be implemented in hardware, firmware, or any suitable combination thereof.

Figure 1:
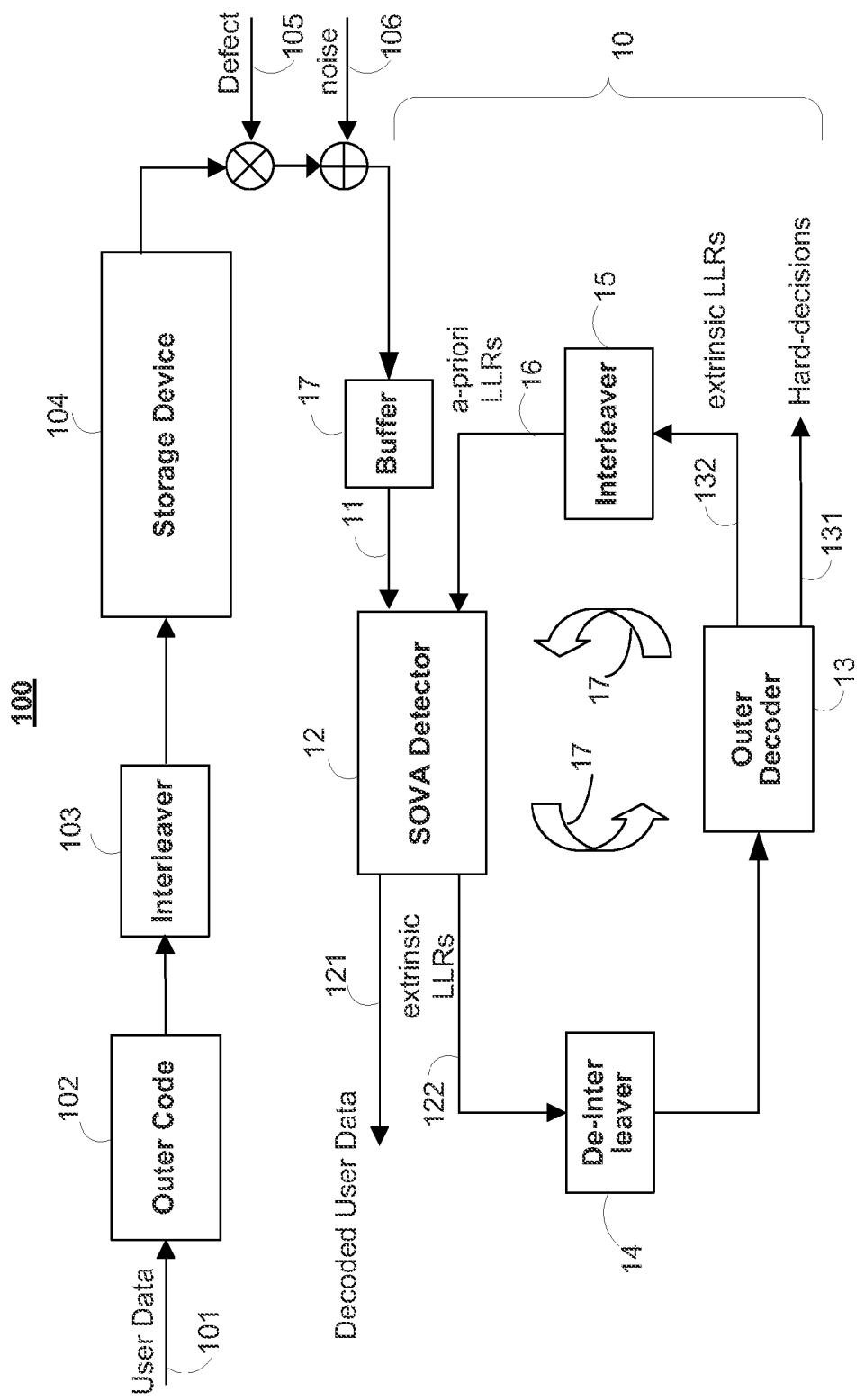
FIG. 1 shows a storage or communications system according to an embodiment of the present disclosure.

FIG. 1 illustrates a memory system 100 according to an embodiment of the present disclosure. In some embodiments, system 100 implements an RS-less (i.e., ITR ECC) architecture for a storage system.

User data are input into system 100 at 101. The input data are encoded using an outer code 102, such as a turbo code, an LDPC code or a convolutional code. For simplicity, and without limiting the disclosure as such, it will be assumed that outer code 102 is an LDPC code. An LDPC code, C, is specified in terms of low-density (sparse) M-by-N binary parity check matrix H, where N is the length of a codeword in C, M is the number of parity bits, and $K=N-M$ is a user data size. A binary string c is a codeword in C if and only if $H \cdot c = 0$, i.e., if the 'syndrome' produced by binary string c is an all-zero syndrome. The present disclosure applies to all types of LDPC codes. This includes both regular and irregular LDPC codes, regardless whether they are structured or random-like.

In some embodiments, the encoded data may be interleaved at 103, and then sent to storage device 104. The storage device 104 may represent an electrical (e.g., RAM, ROM, FLASH), magnetic (e.g., a hard disk), optical (e.g., CD, DVD, holographic), or any other suitable storage medium in which the information-carrying signals may be stored. When data is stored in or read from the storage device 104, defects 105 and noise 106 may be introduced. In some embodiments, defects 105 are due to thermal asperities and/or physical imperfections within the storage device 104. In some embodiments, noise 106 is or may be modeled as additive white Gaussian (AWGN) noise.

Receiver/decoder portion 10 implements an illustrative iteratively-decoded channel. Equalized data from the detector front end (e.g., a FIR filter; not shown) are input at 11. In some embodiments, the equalized data may be stored in an optional buffer 17.

The decoder portion 10 may include a channel decoder/detector 12. The soft decoder 12 may include a SOVA detector, which produces non-return-to-zero (NRZ) output 121, and LLR output 122. However, any suitable soft decoder, such as a BCJR decoder, may be used. The decoder portion 10 may also include an outer decoder 13 (e.g., an LDPC decoder, a turbo decoder, a convolutional decoder, or any other suitable decoder).

During iterative decoding, the LLR output 122 of the soft decoder 12 may pass through the de-interleaver 14 before serving as input to the outer decoder 13. The outer decoder 13 provides hard decisions 131 and LLR output 132. The LLR output 132 may pass through interleaver 15 which provides de-interleaved LLRs as a priori LLR inputs 16 to the soft decoder 12. As indicated by arrows 17, the soft decoder 12 and the outer decoder 13 are used iteratively—e.g., there may be multiple iterations—and the detector output 121 may be used as the decoded output—i.e., the soft decoder 12 may be the last stage in the iterative decoding process.

The iterative decoder 10 may continue iterative processing between the soft decoder 12 and the outer decoder 13 for a certain number of iterations before terminating the iterative process and outputting a message estimate. For example, the iterative decoder 10 may run for a fixed and predetermined number of iterations, until convergence of LLRs values and/or until an output having an all-zero syndrome (i.e. a syndrome having a zero syndrome weight) is determined.

In accordance with some embodiments of the present disclosure, if the iterative decoder portion 10 fails to return a valid codeword after decoding, the decoded data or related soft information may be further processed by an error recovery circuitry (not shown), which implements various processes for detecting, classifying, and correcting residual errors that remain after the iterative decoder portion 10 has returned a decoding decision.

Figure 2:
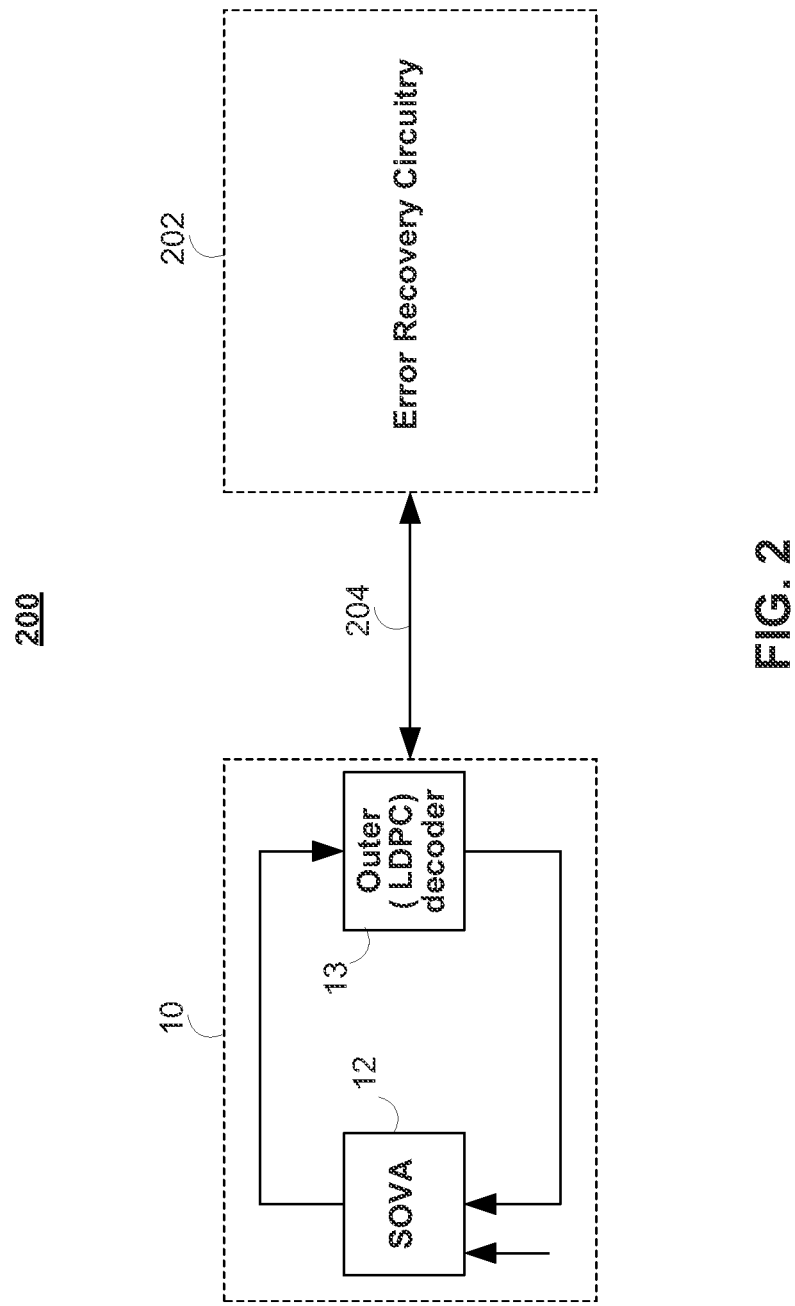
FIG. 2 shows an error recovery system according to an embodiment of the present disclosure.

FIG. 2 illustrates error recovery system 200 according to an embodiment of the present disclosure. System 200 includes the iterative (i.e., RS-less) decoder portion 10 and an error recovery circuitry portion 202. In some embodiments, system 200 may be a part of memory system 100—i.e., the error recovery circuitry portion 202 may be the error recovery circuitry portion as described above in connection with FIG. 1. It should be noted that although circuitries 10 and 202 are shown as separate elements for clarity, error recovery processes in accordance with the present disclosure may be implemented partially or entirely within the decoder portion 10. In this illustrative embodiment, the iterative decoder portion 201 includes SOVA detector 12 and LDPC decoder 13. However, as described above, any other suitable iterative decoding architecture may be used.

The error recovery circuitry 202 may be initiated if the iterative decoder portion 10 fails to correctly decode codeword in regular (i.e., on-the-fly) decoding mode. The error recovery circuitry 202 may receive, through communication link 204, information indicating that iterative decoder portion 10 finished decoding a codeword received from memory. In some embodiments, the error recovery circuitry may also receive information regarding whether this decoding failed or succeeded, and in some cases, also may also receive information about the type of failure, e.g., the syndrome weight of the LDPC failure. Based on processing the received information, the error recovery circuitry 202 may instruct the memory system 100 (through, e.g., the communication link 204) to re-read the codeword from memory. The error recovery circuitry 202 may also select one of several error recovery methods for recovering the codeword.

Figure 3:
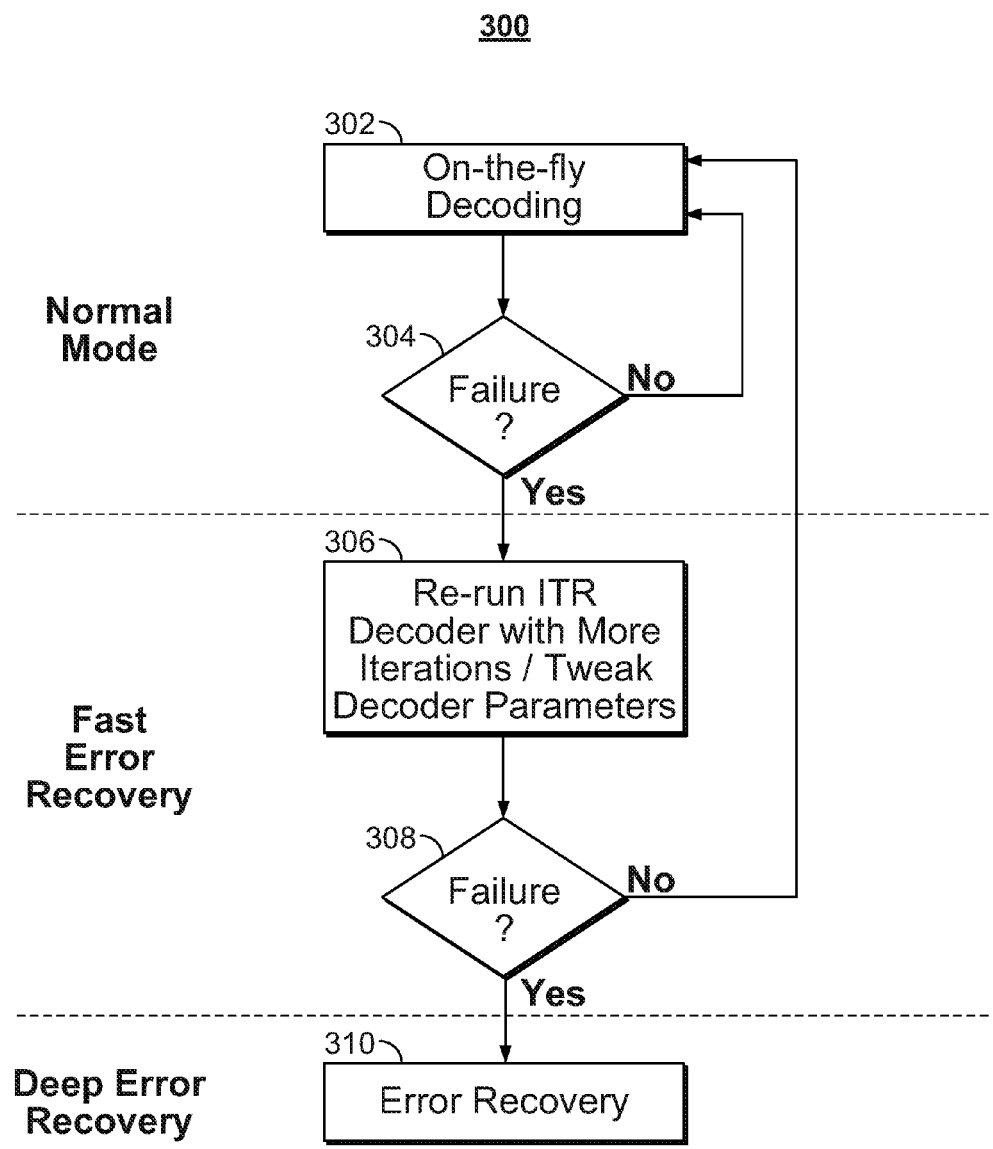
FIG. 3 shows an illustrative process 300 for error recovery according to an embodiment of the present disclosure.

FIG. 3 illustrates a process 300 for error recovery in for iterative (i.e., RS-less) memory architectures according to an embodiment of the present disclosure. In some embodiments, process 300 may be implemented by the error recovery circuitry 202 of FIG. 2.

At 302, during normal (i.e., on-the-fly) decoding mode, iterative decoder 10 may decode data from memory as described above. In some embodiments, during normal decoding mode the decoder may be configured with a first set of parameters. For example, during normal decoding mode the iterative decoder portion 10 may decode using a certain number channel iterations and a certain number of LDPC iterations. In normal decoding mode, the iterative decoder portion 10 may be optimized to deal with random errors.

At 304, it is determined whether the iterative decoder portion 10 has failed to correctly decode a codeword (for ease of reference, such a codeword will be referred to as a 'failed codeword'). If the codeword has been correctly decoded, process 300 returns to 302, and the normal decoding process proceeds as usual. For example, memory system 100 may proceed to read another codeword from the storage device 104. However, if at 304 a decoder failure is detected, process 300 proceeds to an error recovery mode. In some embodiments, process 300 may proceed to a first phase of the error recovery mode, which will be referenced herein as a 'fast' recovery mode.

At 306, the process 300 may enter the fast error recovery mode. In this mode, the error recovery circuitry 202 operating according to process 300 may instruct memory system 100 to re-decode the failed codeword from the storage device 104. In some embodiments, where the storage device 104 is a hard disk drive (HDD), the magnetic disk may spin around so that the sector containing the codeword in question may be re-read. In these embodiments, the re-read process may consume a certain period of time. Because data samples corresponding to the failed codeword may still be stored in the buffer 17, the error recovery circuitry 202 may further instruct the iterative decoder 10 to re-decode these data samples while the re-read operation is being performed. In particular, the error recovery circuitry 202 may reconfigure the iterative decoder 10 with a second set of parameters different from those used by the iterative decoder 10 during normal decoding mode. In some embodiments, during the fast error recovery mode the iterative decoder 10 may be configured to decode the data samples with a different number of channel iterations and/or a different number of LDPC iterations than the corresponding numbers of channel and/or LDPC iterations used by the decoder 10 during normal decoding mode. In some embodiments, the number of channel and/or LDPC iterations used by the iterative decoder 10 in the error recovery mode may be greater than the number of channel and LDPC iterations used by the iterative decoder 10 in the normal decoding mode. Furthermore, the ratio of channel iterations to LDPC iterations in the error recovery mode may be different from the ratio of channel iterations to LDPC iterations in normal decoding mode. For example, the iterative decoder 10 may perform one channel (SOVA) iteration followed by one LDPC iteration when it operates on data samples in normal decoding mode, and may perform one channel (SOVA) iteration followed by three LDPC iterations when it operates on data samples in error recovery mode.

Advantageously, re-decoding the channel samples (i.e., re-running the iterative decoder 10) using more channel/LDPC iterations may provide decoding performance improvements. This feature of the present disclosure may be seen as being in direct contrast to a memory architecture utilizing RS codes, where re-running an RS decoder using the same decoder input would result in the same outcome, i.e., a failure to correctly decode the received codeword. Accordingly, the period of time that may afforded by a re-read process may be advantageously used within an iterative (i.e., RS-less) decoding architecture according to an embodiment of this disclosure in order to attempt to correctly decode the data samples associated with the failed codeword.

At 308, it is determined whether process 300 has succeeded at 306 at correctly decoding the data samples associated with the failed codeword. If it is determined that the samples associated with the failed codeword have been correctly decoded at 306, process 300 returns to 302 and normal decoding resumes. However, if process 300 has failed at 306 to decode the data samples associated with the failed codeword, the process 300 may proceed to a next phase of error recovery, which will be termed herein as a 'deep' error recovery mode.

At 310, the process 300 may enter the deep error recovery mode. In this mode, the error recovery circuitry 202 may identify a source of failure (i.e., an error type) associated with the failed codeword, and select one or more error recovery schemes for the failed codeword based on the determined error type. In some embodiments, the error recover schemes may be chosen based on an indicator, such as e.g., the syndrome pattern and/or syndrome weight associated with the failed codeword, or a reliability metric (such as a log-likelihood ratio (LLR) based reliability metric) associated with the failed codeword.

The error recovery schemes utilized by process 300 at 306 (i.e., available to the error recovery circuitry 202) in deep error recovery mode may be adapted to deal with distinct sources of failure. Some of these sources of failure will be described below.

One such source of failure may be caused by errors in read-head position within memory system 100. Such errors occur when the read-head (or other suitable mechanism) used by the storage device 104 to read a memory sector corresponding to the codeword may be subject to errors in read-head fly height or positioning errors with respect to the track containing the sector. Such errors may be addressed during a re-read operation as described above by, e.g., adjusting appropriate read-head parameters.

Another source of failure may be an error floor type failure associated with the iterative decoder 10. Error-floor type failures, as well as methods and systems for handling error-floor type failures will be described below in connection with FIGS. 4A and 4B.

Another source of failure is a defect type failure associated with the defects 105 in data read from the storage device 104. While the defects 105 may be due to imperfections within the storage device 104, their influence on the actual failure or success of the decoder 10 in decoding the codeword may be vastly different for an iterative decoding architecture (such as, e.g., the architecture implemented by the decoder 10) as compared to an RS-based decoding architecture. Defect type failures, as well as methods and systems for handling defect type failures will be described below in connection with FIGS. 5A and 5B.

Another source of failure may be a synchronization type failure associated with the data read from the storage device 104. Such a failure may occur when a synchronization mark pattern was not detected within the read data, or when the synchronization mark pattern is incorrectly detected due to, e.g., defects 105 and noise 106 within the received data. Synchronization type failures, as well as methods and systems for handling synchronization type failures will be described below in connection with FIGS. 6A and 6B.

Process 300 of FIG. 3 is merely illustrative. Any operations in process 300 may be modified (e.g., performed in a different order), combined, or removed, and any additional operations may be added to process 300, without departing from the scope of the present disclosure.

Figure 4A:
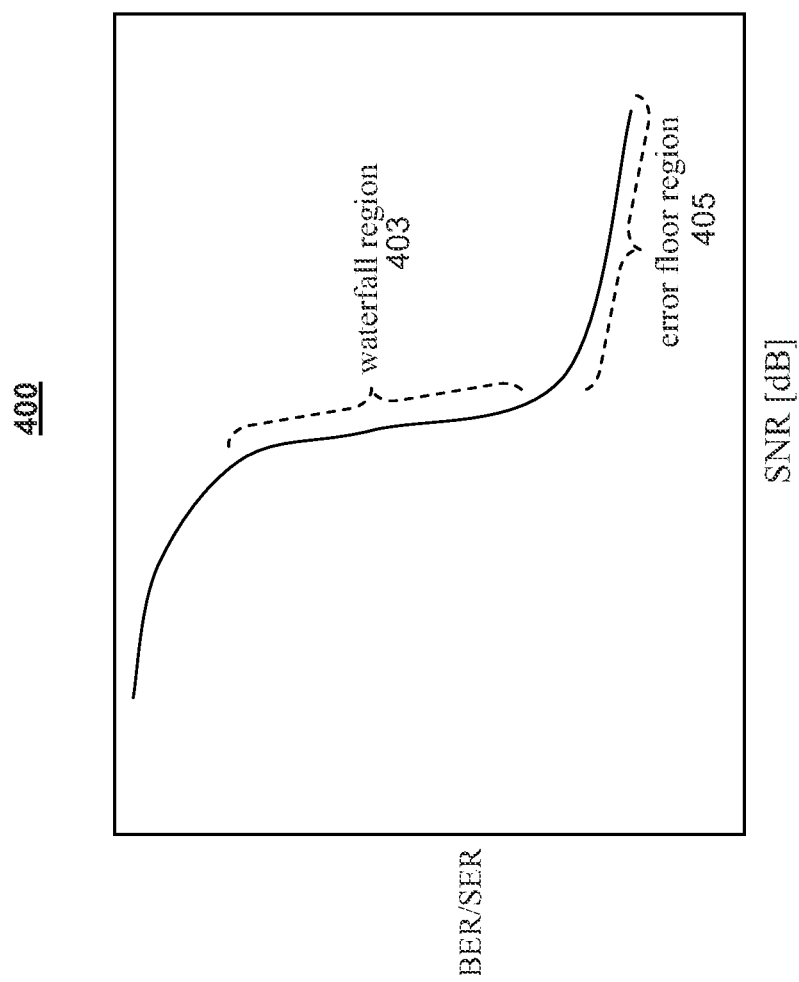
FIG. 4A shows an illustrative iterative code performance curve according to an embodiment of the present disclosure.

FIG. 4A shows a performance curve 400 of an iterative decoding scheme according to an embodiment of the present disclosure.

The performance capability of a coding scheme, such as a LDPC coding scheme, is often described by the code's performance curve, which is a plot of signal-to-noise ratios (SNR) vs. Bit Error Rate (BER) or Sector Error Rate (SER). The performance curve of LDPC codes generally consists of two regions: the waterfall region 403 and the error floor region 405. In the waterfall region 403, the code's BER (or equivalently, SER) decreases rapidly with improvements in SNR. However, in the high SNR operating region, the BER/SER disadvantageously plateaus to an error floor 405, meaning that further improvements in channel condition would not lead to lower BER/SER. Although the error floors of well-designed LDPC codes are generally low, they may not be acceptable for memory systems that may guarantee high degree of data reliability.

Figure 4B:
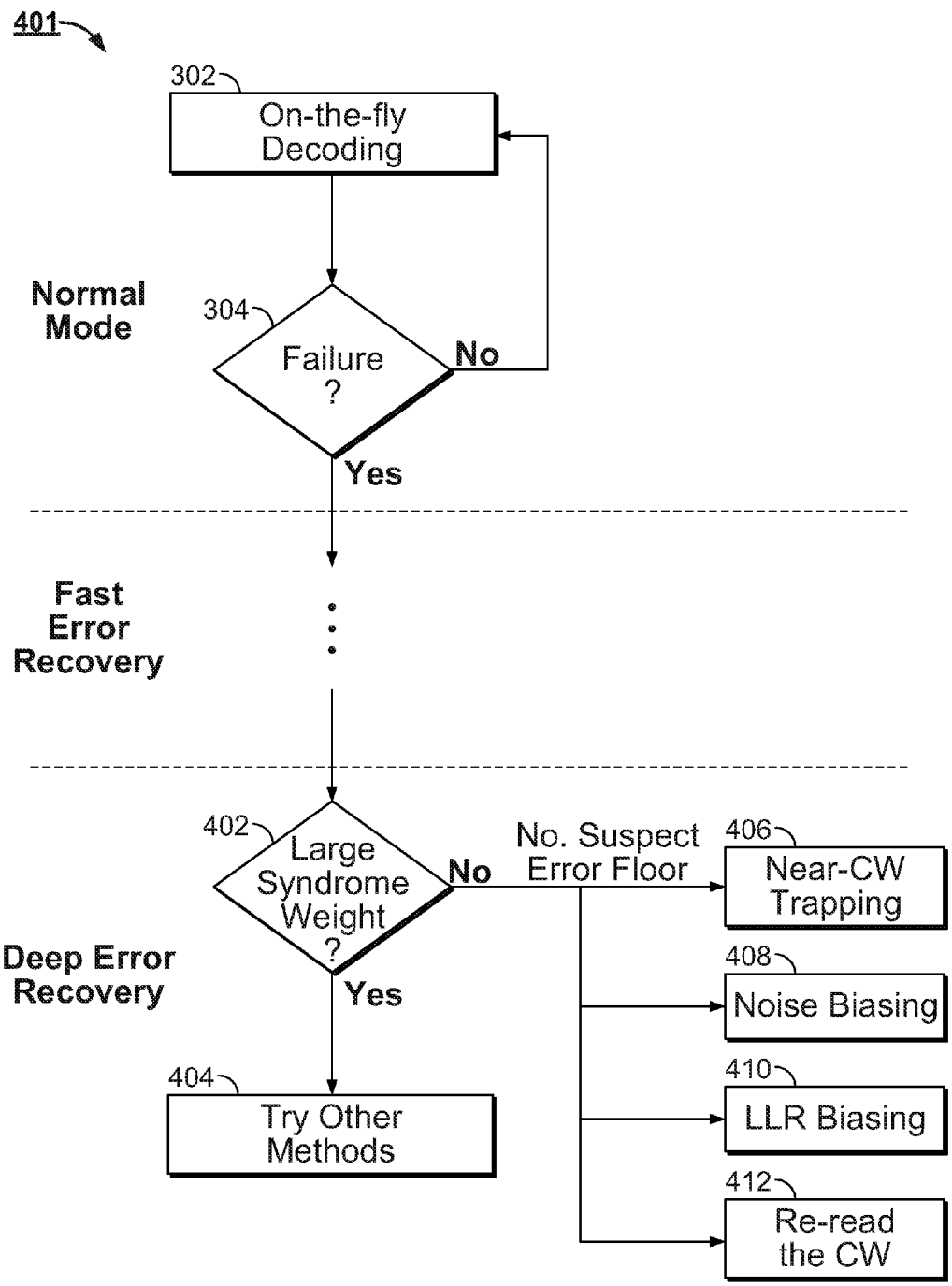
FIG. 4B shows an illustrative process for handling error-floor type failures according to an embodiment of the present disclosure.

FIG. 4B shows an illustrative process 401 for handling error-floor type failures according to an embodiment of the present disclosure. In some embodiments, process 401 may be implemented by the error recovery circuitry 202 of FIG. 2. In some embodiments, process 401 may be a part of process 300. In some embodiments, process 401 further illustrates one of error recovery schemes available to/selected by process 300 at 310 during the deep error recovery mode.

Error-floor type failures in LDPC codes (such as the error floor region 405) are largely due to the existence of trapping sets. Trapping sets are sets of erroneous bits that result in few unsatisfied parity check equations within the parity check matrix H, and cannot be iteratively decoded by the iterative decoder 10. Accordingly, process 401 provides a methodology for handling trapping sets. Advantageously, process 401 may be used to lower the error floor 405 of an LDPC decoder, such as the one present within the iterative decoder 10.

It should be noted that memory system 100, as well as process 401 according to an embodiment of the present disclosure may optionally employ an outer encoding scheme (e.g., a Bose Ray-Chaudhuri (BCH) encoding scheme) to reduce the error floor 405. In some embodiments, the outer BCH encoding scheme may be used before the iterative encoder 102, and the corresponding BCH decoding scheme may be employed before/within the iterative decoder portion 10. Because error floor 405 may be dominated by error events with small Hamming weight (where relatively few bits of a failed codeword may be in error, memory system 100 may use an outer BCH code with small correction power, e.g., t=8 or t=10, to successfully correct many error events in the error floor region. Furthermore, the performance of the decoder 10 may be further improved by using a BCH encoding scheme with a higher error correction capability.

During the normal (i.e., on-the fly) decoding mode and the fast error recovery mode, process 401 may proceed in a manner similar to process 300 of FIG. 3. If process 401 fails correctly decode a received codeword during both the normal decoding mode and the fast error recovery mode, process 401 proceeds to the deep error recovery mode.

At 402, in deep error recovery mode, process 401 may determine whether a an error-floor type failure has occurred. In some embodiments, process 401 may base this determination on comparing a syndrome weight of a syndrome produced by the failed codeword with a threshold value. If the syndrome weight is larger than the threshold value, process 401 may proceed to 404, and other error recovery schemes may be attempted. However, if the syndrome weight is equal to or less than the threshold, an error-floor type failure may have occurred. Accordingly, process 401 may employ one or more of several error recovery schemes, such as near-codeword trapping 406, noise biasing 408, LLR biasing 410, or re-reading the failed codeword at 412 in order to attempt to successfully decode the failed codeword.

At 406, Process 401 may employ a near-codeword trapping scheme in order to attempt to successfully decode the failed codeword. Near-codeword trapping involves the utilization of the syndrome associated with the failed codeword in order to correct errors that may be due to near-codewords/trapping sets. Use of near-codeword trapping schemes to handle error-floor type failures is further described in a co-pending, commonly-assigned U.S. patent application No. 12/180,229, filed on Jul. 25, 2008, which is incorporated by reference herein in its entirety.

At 408, process 401 may employ noise biasing scheme in order to attempt to successfully decode the failed codeword. Noise biasing involves adding a randomized noise bias component to data samples corresponding to the failed codeword, and re-decoding the data samples. Adding a noise component may change a decoding trajectory of the iterative decoder 10, possibly preventing it from converging to local minima (i.e., the near-codewords/trapping sets, as discussed above). In some embodiments, process 401 may perform multiple iterations of the noise biasing scheme. Advantageously, due to the random nature of the noise biasing scheme, performing multiple iterations of the scheme may improve decoder performance. Use of noise biasing schemes to handle error-floor type failures is further described in a co-pending, commonly assigned U.S. patent application Ser. No. 12/357,200, filed on Jan. 21, 2009, which is incorporated by reference herein in its entirety.

At 410, process 401 may employ a log likelihood ratio based (LLR-based) post-processing scheme (i.e., an LLR biasing scheme) in order to attempt to successfully decode the failed codeword. LLR-based post-processing involves adjusting various parameters of the iterative decoder 10 based on the syndrome (which may initially be provided by the iterative decoder 10) associated with the failed codeword, and re-decoding the data samples corresponding to the failed codeword using the adjusted iterative decoder 10. In some embodiments, the LLR-based post-processing scheme may, prior to re-decoding, modify symbol positions in the failed codeword that correspond to a particular unsatisfied parity check equation. In some embodiments, the LLR-based post-processing scheme may modify messages used in an iterative message algorithm within the iterative decoder 10 that correspond to the symbol positions. Use of LLR-based post-processing schemes (i.e., LLR biasing schemes) to handle error-floor type failures is further described in a co-pending, commonly assigned U.S. patent application Ser. No. 12/327,627, filed on Dec. 3, 2008, which is incorporated by reference herein in its entirety.

At 412, process 401 may additionally and/or alternatively instruct memory system 100 to re-read from the storage device 104 data corresponding to the failed codeword.

It should be noted that process 401 may employ any suitable error recovery scheme adapted to handle error-floor type failures alongside and/or in place of any of the above-described error recovery schemes. For example, in some embodiments, process 401 may cause the iterative decoder 10 to attempt to decode data samples corresponding to the failed codeword using message-passing and post-processing algorithms different from those that may have been used by the iterative decoder 10 during the normal decoding mode.

Process 401 of FIG. 4B is merely illustrative. Any operations in process 401 may be modified (e.g., performed in a different order), combined, or removed, and any additional operations may be added to process 401, without departing from the scope of the present disclosure.

Figure 4C:
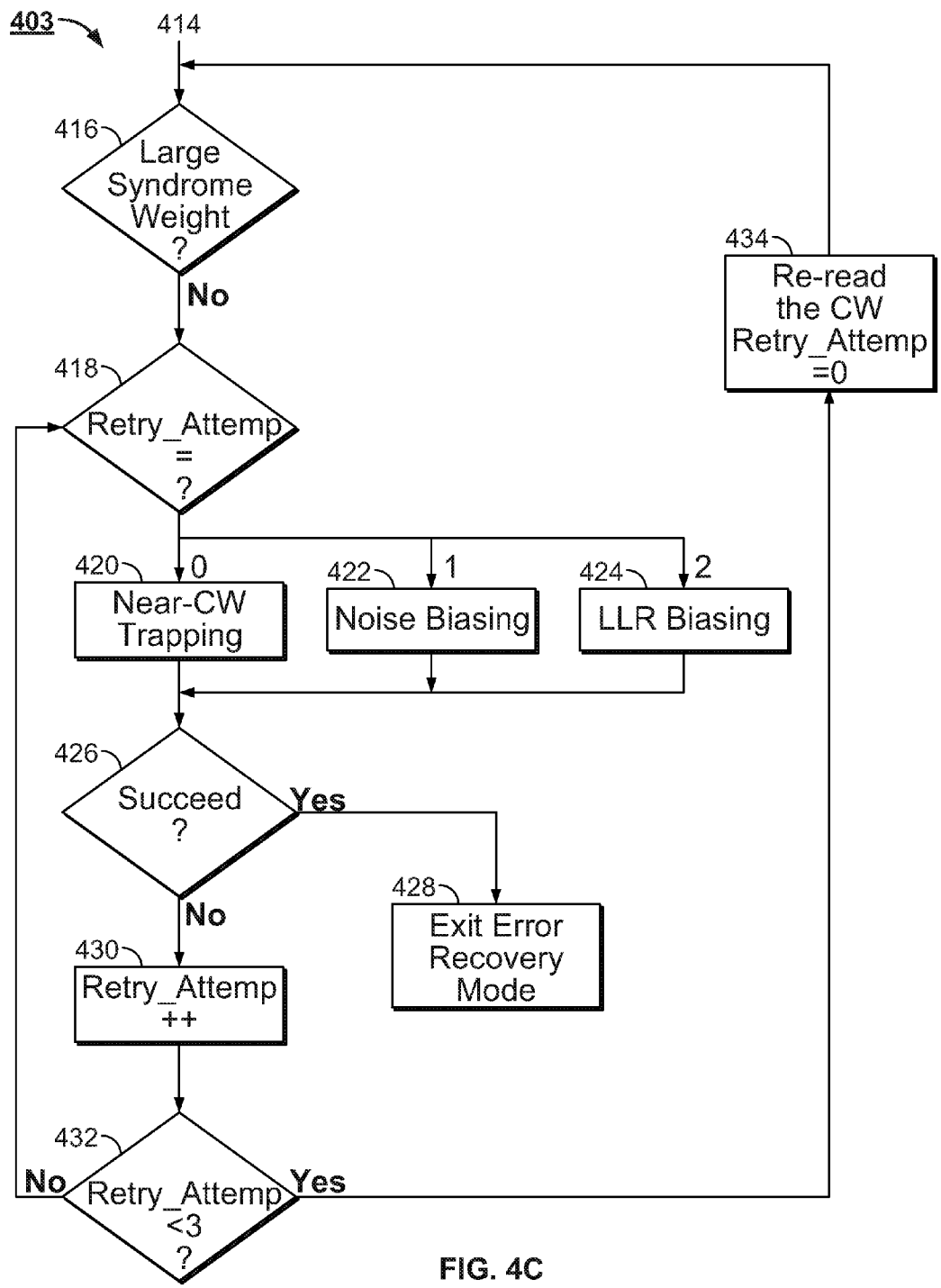
FIG. 4C shows a further illustrative process for handling error-floor type failures according to an embodiment of the present disclosure.

FIG. 4C shows a further illustrative process 403 for handling error-floor type failures according to an embodiment of the present disclosure. Process 403 may illustrate in greater detail the operations performed by process 401 of FIG. 4B during the deep error recovery mode. In some embodiments, process 403 may be implemented by the error recovery circuitry 202 of FIG. 2. In some embodiments, process 403 may be a part of process 300. In some embodiments, process 403 further illustrates one of error recovery schemes available to/selected by process 300 at 310 during the deep error recovery phase.

Process 403 may be initiated at 414.

At 416, process 403 may compare a syndrome weight of a syndrome produced by the failed codeword with a threshold value. If the syndrome weight is equal to or less than the threshold value, an error-floor type failure may have occurred, and process 403 proceeds to employ or more of several error recovery schemes, such as near-codeword trapping 420, noise biasing 422, LLR biasing 424, or any appropriate error recovery scheme in order to attempt to successfully decode the failed codeword.

At 420, process 403 may employ a near-codeword trapping scheme in order to attempt to successfully decode the failed codeword. Near-codeword trapping schemes are described in more detail above in connection with operation 406 of FIG. 4B.

At 422, process 403 may employ a noise biasing scheme in order to attempt to successfully decode the failed codeword. Noise biasing schemes are described in more detail above in connection with operation 408 of FIG. 4B.

At 424, process 403 may employ LLR-based post-processing scheme (i.e., an LLR biasing scheme) in order to attempt to successfully decode the failed codeword. LLR-based post-processing schemes are described in more detail above in connection with operation 410 of FIG. 4B.

It should be noted that process 403 may employ any suitable error recovery scheme adapted to handle error-floor type failures alongside and/or in place of any of the above-described error recovery schemes. For example, in some embodiments, process 403 may cause the iterative decoder 10 to attempt to decode data samples corresponding to the failed codeword using message-passing and post-processing algorithms different from those that may have been used by the iterative decoder 10 during the normal decoding mode.

At 426, if one of the error recovery schemes 420, 422, and/or 424 has been successful in correctly decoding the failed codeword, process 403 exits the error recovery mode at 428. However, if it is determined at 426 that the scheme employed at a current iteration has not succeeded, process 403 may employ another error recovery scheme to attempt to decode the failed codeword. Process 403 may apply each of the error recovery schemes 420, 422, and 424 in turn. In the illustrative process 403, such cycling through the available schemes is conceptually represented by elements 418, 430, and 432. In particular, an error recovery scheme corresponding to the current value of the variable Retry_attemp (i.e., 0, 1, or 2) is attempted. If it is determined at 426 that an error recovery scheme at a current iteration has not succeeded, the Retry_attemp variable is incremented at 430. If it is determined at 432 that the value of the Retry_attemp variable is less than three, process 403 loops back to 418, and another error recovery scheme is attempted. It should be noted that the conceptual elements 418, 430, and 432 are merely illustrative, and any other process which attempts to decode the failed codeword with one or more of the error recovery scheme 420, 422, 424 (or any other appropriate error recovery scheme) may be used without departing from the scope of the present disclosure.

If it is determined at 432 that none of the error recovery schemes 420, 422, 424 has correctly decoded the failed codeword (e.g., if it is determined at 432 that Retry_attemp is greater than or equal to three), process 403 may instruct memory system 100 to re-read the codeword at 434. In some embodiments, the Retry_attemp variable may be reset, and process 403 may loop back to 416.

Process 403 of FIG. 4C is merely illustrative. Any operations in process 403 may be modified (e.g., performed in a different order), combined, or removed, and any additional operations may be added to process 403, without departing from the scope of the present disclosure.

Figure 5A:
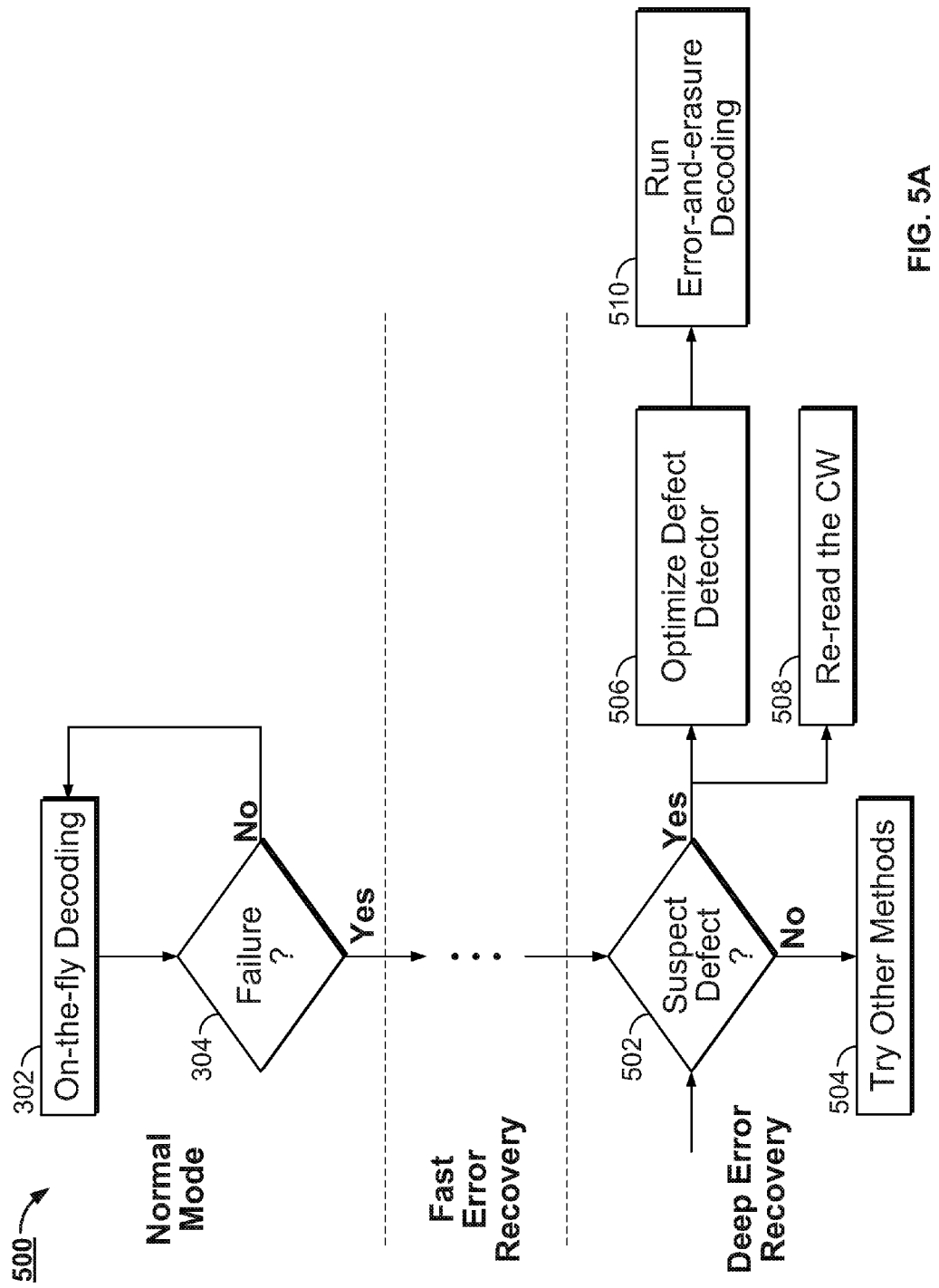
FIG. 5A shows an illustrative process for handling defect type failures according to an embodiment of the present disclosure.

FIG. 5A shows an illustrative process 500 for handling defect type failures according to an embodiment of the present disclosure. In some embodiments, process 500 may be implemented by the error recovery circuitry 202 of FIG. 2. In some embodiments, process 500 may be part of process 300 of FIG. 3. In some embodiments, process 500 further illustrates one of error recovery schemes available to/selected by process 300 at 310 during the deep error recovery phase.

During the normal decoding mode and the fast error recovery mode, process 500 may proceed in a manner similar to process 300 of FIG. 3. If process 500 fails correctly decode a received codeword during both the normal decoding mode and the fast error recovery mode, process 500 proceeds to the deep error recovery mode.

At 502, process 500 may determine whether a defect may have occurred. In some embodiments, this determination is carried out within the iterative decoder 10 by a dedicated defect detector (not shown). The defect detector may operate on data samples provided by the FIR filter (not shown), detecting defect locations and notifying the soft decoder 12 via, e.g., marking appropriate bit locations within the received data samples. If it is determined at 502 that a defect has likely not occurred, other error recovery schemes may be attempted at 504. However, if it is determined that a defect has likely occurred, process 500 may proceed to 506 and 508.

At 506, the defect detector is re-configured and/or re-optimized based on the type of defect that has occurred.

At 508, process 500 may additionally and/or alternatively instruct memory system 100 to re-read from the storage device 104 data corresponding to the failed codeword.

In some embodiments, the defect detector may classify defects according to their effect on the performance of the decoder 10, and as well as the ease with which they may be detected. In classifying the defects, the defect detector may employ a model of defect length and severity.

In some embodiments, the dominant defects 105 introduced into the read data may so-called drop-out defects, where the data waveform read from the memory experiences drop-outs (i.e., intervals where the waveform has a low magnitude) in some number of consecutive bit locations. These defects are well modeled via the two parameters: an amplitude attenuation factor $\alpha$ and a length of the defect L.

With regard to attenuation $\alpha$, defects may be classified as severe and mild as follows. If the attenuation alpha is small (e.g., $\alpha \leq 0.3$), a defect may classified as severe, as it can be very harmful to the iterative decoder 10 if undetected. On the other hand, if the attenuation $\alpha$ is larger (e.g., $\alpha \geq 0.7$), the defect may be classified as mild, as it can be reliably handled by the iterative decoder 10 in the course of normal decoding.

Defects may further be classified according to their impact on the performance of the iterative decoder 10 if they are detected or, conversely, if they are left undetected.

If a defect is detected, the iterative decoder 10 may handle it with relative ease by marking it as an erasure, and performing Error-and-Erasure decoding. This may be done on-the-fly for soft iterative decoders, as erasures of soft-inputs naturally allows for error-and-erasure soft decoding.

Undetected defects below a certain threshold length can be handled reliably by the iterative decoder 10, even if they are not detected. However, undetected defects greater than the threshold length may have very severe effect on the performance of at iterative (i.e., RS-less) decoder 10. Even if such defects are relatively infrequent, they could dominate the overall SFR performance of the decoder 10.

Furthermore, defects may be classified with regard to their relation to the defect detector. For instance, the defect detector may easily detect and mark up long defects. The defect detector may also detect and mark up shorter defects if they are very severe. However, very short defects, or short defects that are not very severe, might be difficult to detect without significantly increasing occurrences of false-positive defect detection, therefore degrading on-the-fly performance of the iterative decoder 10.

Based on the above, the defects may be classified into four classes. A first class of defects may contain short/mild defects—i.e., defects having a relatively short length L and associated with a relatively high attenuation $\alpha$. Such short/mild defects may be the hardest to detect, but may not be very harmful so system performance if undetected. A second class of defects may contain short/severe defects—i.e., defects having a relatively short length L and associated with a relatively low attenuation $\alpha$. Such short/severe defects may be the hard to detect, and may be very harmful to system performance if undetected. A third class of defects may contain long/mild defects—i.e., defects having a relatively long length L and associated with a relatively high attenuation $\alpha$. Such long/mild defects may be the easy to detect, and may not be very harmful to system performance if undetected. A fourth class of defects may contain long/severe defects—i.e., defects having a relatively long length L and associated with a relatively low attenuation $\alpha$. Such long/severe defects may be the easiest to detect, and may be very harmful to system performance if undetected.

In some-embodiments, based on the above, process 500 may re-configure and/or re-optimize the defect detector based on determining which class of defects is most likely to have occurred within the failed codeword. In some embodiments, process 500 may optimize the defect detector to detect the fourth class of defects—defects with long length L and with severe attenuation (i.e., a low $\alpha$)—during normal decoding mode. However, in error recovery mode, process 500 may reconfigure/re-optimize the defect detector for detecting the first and/or second class of defects (i.e., short defects with severe and/or mild attenuation). Advantageously, such re-optimization may lead to significant performance gains.

At 510, Error-and-Erasure decoding (which will be described in further detail in connection with FIG. 5B) is performed using the reconfigured defect detector.

Process 500 may additionally and/or alternatively instruct memory system 100 to re-read from the storage device 104 data corresponding to the failed codeword, and perform error-and-erasure decoding on the re-read data using the reconfigured defect detector.

Process 500 of FIG. 5A is merely illustrative. Any operations in process 500 may be modified (e.g., performed in a different order), combined, or removed, and any additional operations may be added to process 500, without departing from the scope of the present disclosure.

Figure 5B:
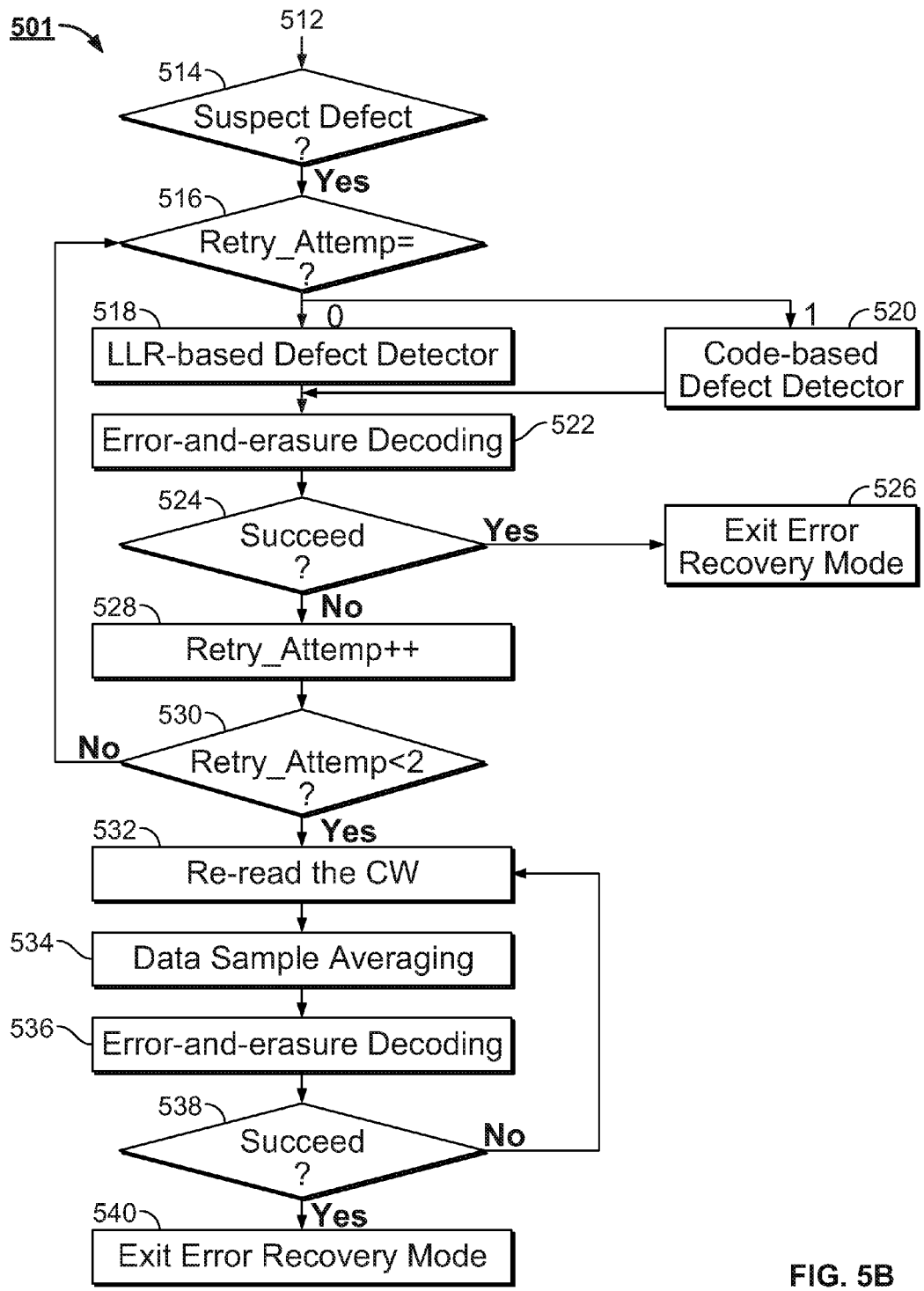
FIG. 5B shows a further illustrative process for handling defect type failures according to an embodiment of the present disclosure.

FIG. 5B shows a further illustrative process 501 for handling defect type failures according to an embodiment of the present disclosure. Process 501 may illustrate in greater detail the operations performed by process 500 of FIG. 5A during deep error recovery mode. In some embodiments, process 501 may be implemented by the error recovery circuitry 202 of FIG. 2. In some embodiments, process 501 may be part of process 300 of FIG. 3. In some embodiments, process 501 further illustrates one of error recovery schemes available to/selected by process 300 at 310 during the deep error recovery phase.

Process 501 may be initiated at 512.

At 514, if it is determined that a defect is likely to be present within the failed codeword, process 501 proceeds to employ or more of several error recovery schemes, such as an LLR-based defect detection scheme 518 or a code-based defect detection scheme 520, each followed by an Error-and-Erasure decoding scheme 522, in order to attempt to successfully decode the failed codeword. It should be noted that process 501 may additionally re-optimize the defect detection schemes 518 and 520 based on the type of defect that was most likely to have occurred within the failed codeword, as discussed previously in connection with process 500 of FIG. 5.

At 518, LLR-based defect detection may be employed in order to attempt to successfully decode the failed codeword. During LLR-based defect detection, defects are detected based on log likelihood ratio reliability metrics associated with the failed codeword. LLR-based defect detection schemes are further described in a co-pending, commonly assigned U.S. patent application Ser. No. 12/328,561, filed on Dec. 4, 2008, which is incorporated by reference herein in its entirety.

At 520, code-based defect detection may be employed in order to attempt to successfully decode the failed codeword. During code based defect detection, defects are detected based on code constraints associated with the failed codeword. Code-based defect detection schemes are further described in the co-pending U.S. patent application Ser. No. 12/328,561.

At 534, Error-and-Erasure decoding is performed. During Error-and-Erasure decoding, defects detected by detection schemes 518 and/or 520 are marked and treated as erasures by the iterative decoder 10. Error-and-Erasure decoding is further described in the co-pending U.S. patent application Ser. No. 12/328,561.

At 524, if one of the error recovery schemes (e.g., 518 followed by 522, 520 followed by 522, or any other suitable error recovery scheme) has been successful in correctly decoding the failed codeword, process 501 exits the error recovery mode at 526. However, if it is determined at 524 that the scheme employed at a current iteration has not succeeded, process 501 may employ another error recovery scheme to attempt to decode the failed codeword. Process 501 may apply each of the error recovery schemes 510 and 520 (each followed by 522) in turn. In the illustrative process 501, such cycling through the available schemes is conceptually represented by elements 516, 528 and 530. In particular, an error recovery scheme corresponding to the current value of the variable Retry_attemp (i.e., 0 or 1) is attempted. If it is determined at 524 that an error recovery scheme at a current iteration has not succeeded, the Retry_attemp variable is incremented at 528. If it is determined at 524 that the value of the Retry_attemp variable is less than two, process 501 loops back to 516, and another error recovery scheme is attempted. It should be noted that the conceptual elements 516, 528 and 530 are merely illustrative, and any other process which attempts to decode the failed codeword with one or more of the error recovery schemes 518 and 520 (each followed by 522), or any other appropriate error recovery scheme, may be used without departing from the scope of the present disclosure.

If it is determined at 530 that none of the error recovery schemes has correctly decoded the failed codeword (e.g., if it is determined at 530 that Retry_attemp is greater than or equal to two), process 501 may instruct memory system 100 to re-read the failed codeword at 532.

At 534, data sample averaging may optionally be performed. During data sample averaging, data samples (received earlier from the storage device 104) corresponding to the failed codeword may be combined (e.g., averaged) with the data samples received when the failed codeword is re-read at 532. In some embodiments, the respective groups of samples may be multiplied by different relative weights during the combining. Advantageously, data sample averaging may suppress the noise 104 introduced into the data read from the storage device 104, thereby possibly improving performance of the iterative decoder 10 during subsequent Error-and-Erasure decoding at 536.

At 538, it is determined whether the Error-and-Erasure decoding performed at 536 has been successful in correctly decoded the failed codeword. If it is determined at 538 that the failed codeword has been successfully decoded, process 501 exits the error recovery mode at 540. However, if it is determined at 538 that the failed codeword has not been successfully decoded, process 501 loops back to 532.

Process 501 of FIG. 5B is merely illustrative. Any operations in process 501 may be modified (e.g., performed in a different order), combined, or removed, and any additional operations may be added to process 501, without departing from the scope of the present disclosure.

Figure 6A:
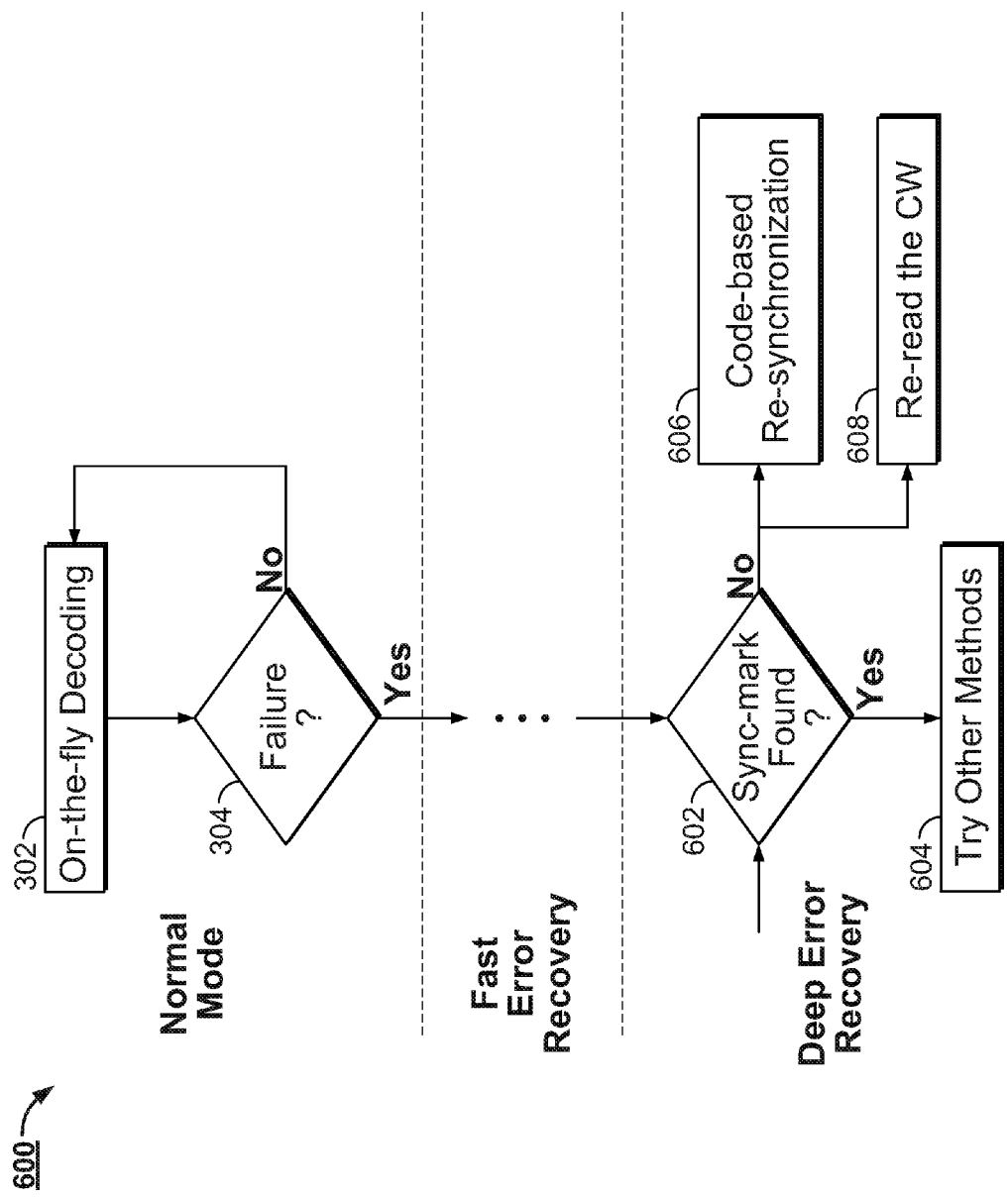
FIG. 6A shows an illustrative process for handling synchronization type failures according to an embodiment of the present disclosure.

FIG. 6A shows an illustrative process 600 for handling synchronization type failures according to an embodiment of the present disclosure. In some embodiments, process 600 may be implemented by the error recovery circuitry 202 of FIG. 2. In some embodiments, process 600 may be part of process 300 of FIG. 3. In some embodiments, process 600 further illustrates one of error recovery schemes available to/selected by process 300 at 310 during the deep error recovery phase.

One reason the iterative decoder 10 may fail to decode a codeword received from the storage device 104 may be a due synchronization type failure associated with the data samples read from the storage device 104. A synchronization mark pattern may be used to, for example, detect codeword and data block boundaries while data is read from the storage device 104. A synchronization type failure may occur when the synchronization mark is either not detected within the codeword or incorrectly detected within the codeword due to, e.g., the defects 105 and the noise 106 within the received data. In particular, while a synchronization mark (SM) detector (which is not shown, but may be present in memory system 100 of FIG. 1) can tolerate a large amount of random noise during a read operation, it may fail when a data sector within the storage device 104 corresponding to the synchronization mark is corrupted by a defect. Advantageously, process 600 may effectively handle such failures, thereby ensuring that the performance of the SM detector (i.e., the synchronization mark detection rate of the SM detector) does not limit system performance.

During the normal decoding mode and the fast error recovery mode, process 600 may proceed in a manner similar to process 300 of FIG. 3. If process 600 fails correctly decode a received codeword during both the normal decoding mode and the fast error recovery mode, process 600 proceeds to deep error recovery mode.

At, 602, process 600 may determine whether a synchronization mark has been correctly identified. In some embodiments, this determination may be based on convergence (or lack thereof) of the iterative decoder 10. In some embodiments, this determination may be based on the syndrome weight associated with the failed codeword. In some embodiments, a syndrome weight greater than a certain threshold may indicate the presence of a synchronization mark type failure due to e.g., an incorrectly identified synchronization mark. If it is determined at 602 that a synchronization mark has been correctly identified, process 600 proceeds to 604, and other error recovery schemes are attempted. However, if it is determined at 602 that a synchronization mark has not been correctly identified, a synchronization type failure may have occurred. Accordingly, process 600 may perform code-based re-synchronization 606 in order to attempt to correctly decode the failed codeword.

At 608, additionally and/or alternatively, process 600 may instruct memory system 100 to re-read the failed codeword.

Process 600 of FIG. 6A is merely illustrative. Any operations in process 600 may be modified (e.g., performed in a different order), combined, or removed, and any additional operations may be added to process 600, without departing from the scope of the present disclosure.

Figure 6B:
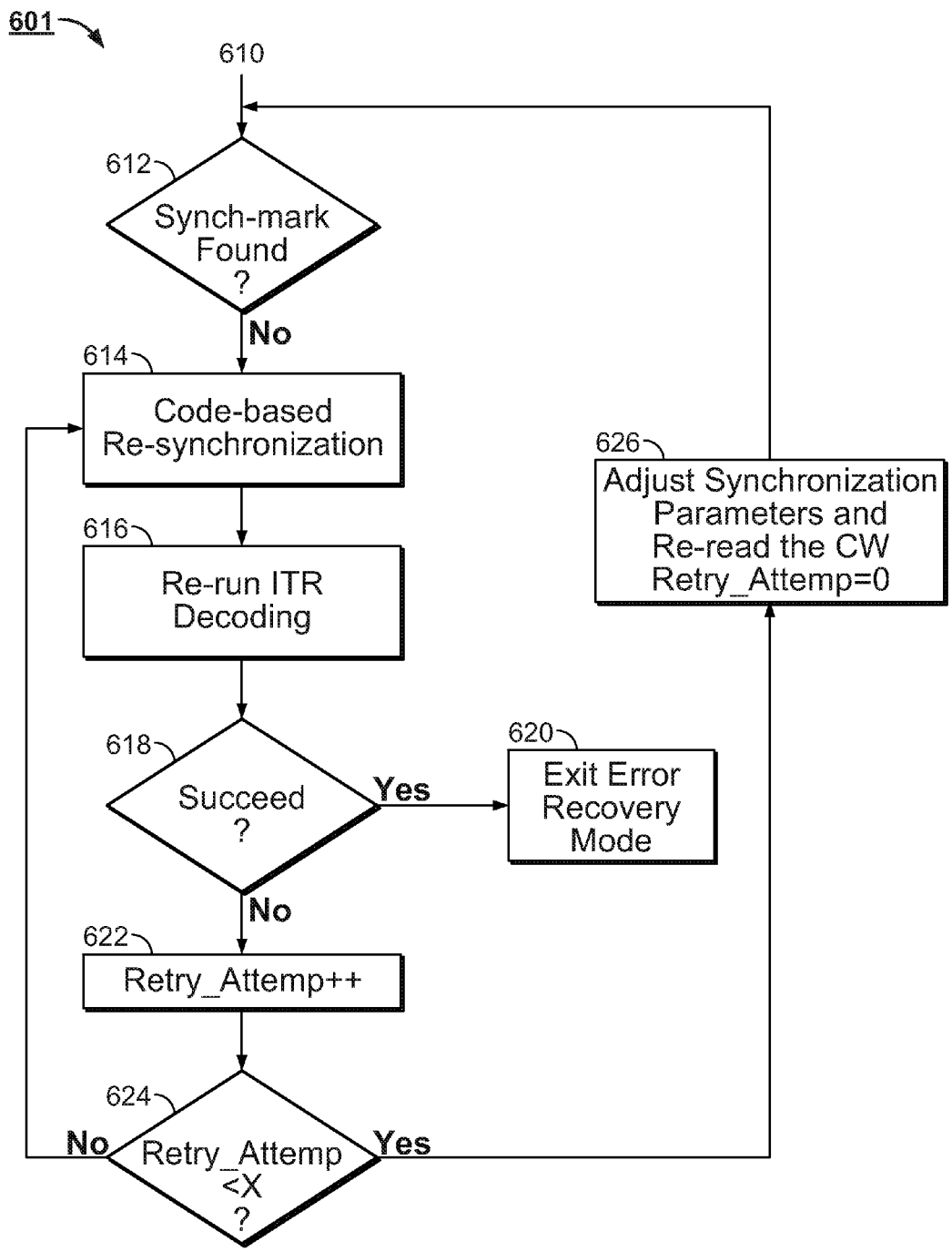
FIG. 6B shows a further illustrative process for handling synchronization type failures according to an embodiment of the present disclosure.

FIG. 6B shows a further illustrative process 601 for handling synchronization type failures according to an embodiment of the present disclosure.

Process 601 may illustrate in greater detail the operations performed by process 600 of FIG. 6A during deep error recovery mode. In some embodiments, process 601 may be implemented by the error recovery circuitry 202 of FIG. 2. In some embodiments, process 601 may be part of process 300 of FIG. 3. In some embodiments, process 601 further illustrates one of error recovery schemes available to/selected by process 300 at 310 during the deep error recovery phase.

Process 601 may be initiated at 610.

At 612, if a synchronization mark has not been correctly identified within the failed codeword, the process may move on to 614.

At 614, re-synchronization may be performed. In some embodiments, the re-synchronization may be code-based re-synchronization. During re-synchronization, the process 601 may choose to use as a synchronization mark a particular set of positions within the data samples stored in the buffer 17.

At 616, the process 601 may instruct the iterative decoder 10 to decode a codeword derived based on the selected set of positions.

At 618, it may be determined whether the decoder 10 has succeeded at correctly decoding the codeword. In some embodiments, this determination may be based on the whether the iterative decoder 10 has converged after a certain number of iterations. If it is determined at 618 that the decoder 10 has succeeded, process 601 exits the error recovery mode at 620. If it is determined at 618 that the decoder 10 has not succeeded, process 601 may retry code-based—re-synchronization. It should be noted that within the illustrative process 601, the process of retrying code-based synchronization is represented by conceptual elements 622 and 624. In particular, if it is determined at 618 that the decoder 10 has not succeeded, a Retry_attemp variable may be incremented at 622. If it is further determined at 624 that the Retry_attemp variable is less than a certain threshold X, process 601 may then loop back to 614. However, it should be noted that any other conceptual process for re-trying code-based synchronization may be used without departing from the scope of the present disclosure.

If it is determined at 624 that a sufficient number of re-try attempts have been made, process 601 may proceed to 626. In some embodiments, the determination regarding the sufficient number of re-try attempts is based on the length of time consumed by a re-read operation for storage device 104 (e.g., the length of time needed for a disk in a hard disk drive to make one revolution).

At 626, process 601 may instruct memory system 100 to adjust various synchronization parameters (e.g., read-head position), used to read data from the storage device 104. Process 601 may then instruct memory system 100 to re-read data corresponding to the failed codeword from the storage device 104. Process 601 may then reset any appropriate parameters (such as, e.g., the Retry_attemp variable) and return to 612.

Process 601 of FIG. 6B is merely illustrative. Any operations in process 601 may be modified (e.g., performed in a different order), combined, or removed, and any additional operations may be added to process 601, without departing from the scope of the present disclosure.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for correcting errors, the method comprising:
decoding data with an iterative decoding scheme having a first set of parameters;
in response to determining that the iterative decoding scheme has failed, re-reading the data;
while the data is being re-read, reconfiguring the iterative decoding scheme with a second set of parameters and decoding the data with the reconfigured iterative decoding scheme;
in response to determining that the reconfigured iterative decoding scheme has failed:
determining an error type associated with the data; and
selecting at least one error recovery scheme of a plurality of error recovery schemes for the data based on the determined error type.

2. The method of claim 1, wherein:
the iterative decoding scheme is associated with a first number of iterations,
the reconfigured iterative decoding scheme is associated with a second number of iterations, and
the second number of iterations is larger than the first number of iterations.

3. The method of claim 1, further comprising determining a syndrome weight of a syndrome associated with the data, wherein:
the error type associated for the data is determined based on comparing the syndrome weight with one or more thresholds.

4. The method of claim 1, further comprising:
determining the error type associated with the data to be an error floor event if a syndrome weight of a syndrome associated the data is less than a threshold; and
in response to determining the error type to be an error floor event, decoding the data using one or more of a near-codeword trapping scheme, a noise-biasing scheme, or a log-likelihood ratio biasing scheme.

5. The method of claim 1, further comprising:
determining the error type associated with the data to be a synchronization error event if a syndrome weight of a syndrome associated with the data is greater than a threshold;
re-synchronizing the data using a re-synchronization scheme; and
decoding the re-synchronized data with the iterative decoding scheme.

6. The method of claim 5 further comprising:
in response to determining that the iterative decoding scheme has failed to correctly decode the re-synchronized data, adjusting synchronization parameters used to read data from a storage device; and
re-reading the data from the storage device using the adjusted synchronization parameters.

7. The method of claim 1, further comprising:
detecting a defect within the decoded data with a defect detection scheme, wherein the defect detection scheme is optimized for detecting defects having a first length;
reconfiguring the defect detection scheme to be optimized for detecting defects having a second length smaller than the first length; and
performing error-and-erasure decoding on the data using the reconfigured defect detection scheme.

8. The method of claim 1, further comprising:
in response to determining that one error recovery scheme has failed, selecting another error recovery scheme for the data; and
processing the data using the another error recovery scheme.

9. The method of claim 1, wherein the re-reading of the data is stopped in response to determining that the reconfigured iterative decoding scheme has correctly decoded the data.

10. The method of claim 1, wherein the data is read from a magnetic disk drive.

11. A system for correcting errors, the system comprising receiver circuitry configured to:
decode data with an iterative decoding scheme having a first set of parameters;
in response to determining that the iterative decoding scheme has failed, re-read the data;
while the data is being re-read, reconfigure the iterative decoding scheme with a second set of parameters and decode the data with the reconfigured iterative decoding scheme;
in response to determining that the reconfigured iterative decoding scheme has failed:
determine an error type associated with the data; and
select at least one error recovery scheme of a plurality of error recovery schemes for the data based on the determined error type.

12. The system of claim 11, wherein:
the iterative decoding scheme is associated with a first number of iterations,
the reconfigured iterative decoding scheme is associated with a second number of iterations, and
the second number of iterations is larger than the first number of iterations.

13. The system of claim 11, wherein the receiver circuitry is further configured to determine a syndrome weight of a syndrome associated with the data, wherein:
the error type associated for the data is determined based on comparing the syndrome weight with one or more thresholds.

14. The system of claim 11, wherein the receiver circuitry is further configured to:
determine the error type associated with the data to be an error floor event if a syndrome weight of a syndrome associated the data is less than a threshold; and
in response to determining the error type to be an error floor event, decode the data using one or more of a near-codeword trapping scheme, a noise-biasing scheme, or a log-likelihood ratio biasing scheme.

15. The system of claim 11, wherein the receiver circuitry is further configured to:
determine the error type associated with the data to be a synchronization error event if a syndrome weight of a syndrome associated with the data is greater than a threshold;
re-synchronize the data using a re-synchronization scheme; and
decode the re-synchronized data with the iterative decoding scheme.

16. The system of claim 15, wherein the receiver circuitry is further configured to:
in response to determining that the iterative decoding scheme has failed to correctly decode the re-synchronized data, adjust synchronization parameters used to read data from a storage device; and
re-read the data from the storage device using the adjusted synchronization parameters.

17. The system of claim 11, wherein the receiver circuitry is further configured to:
detect a defect within the decoded data with a defect detection scheme, wherein the defect detection scheme is optimized for detecting defects having a first length;
reconfigure the defect detection scheme to be optimized for detecting defects having a second length smaller than the first length; and
perform error-and-erasure decoding on the data using the reconfigured defect detection scheme.

18. The system of claim 11, wherein the receiver circuitry is further configured to:
in response to determining that one error recovery scheme has failed, select another error recovery scheme for the data; and
process the data using the another error recovery scheme.

19. The system of claim 11, wherein the re-reading of the data is stopped in response to determining that the reconfigured iterative decoding scheme has correctly decoded the data.

20. The system of claim 11, wherein the data is read from a magnetic disk drive.

* * * * *